United States Patent [19]

Noguchi et al.

[11] Patent Number: 4,889,586

[45] Date of Patent: Dec. 26, 1989

[54] METHOD FOR POLISHING ALGAAS SURFACES

[75] Inventors: Masahiro Noguchi; Osamu Yamamoto, both of Ushiku, Japan

[73] Assignees: Mitsubishi Monsanto Chemical Company; Mitsubishi Kasei Corporation

[21] Appl. No.: 330,587

[22] Filed: Mar. 30, 1989

[30] Foreign Application Priority Data

Apr. 1, 1988 [JP] Japan ................................. 63-80703

[51] Int. Cl.$^4$ ...................... H01L 21/306; B44C 1/22; C03C 15/00; C03C 25/06
[52] U.S. Cl. ................................. 156/636; 156/639; 156/654; 156/662; 156/903; 252/79.5
[58] Field of Search ............... 156/636, 639, 645, 654, 156/662, 903; 252/79.1, 79.5; 51/317

[56] References Cited

U.S. PATENT DOCUMENTS

| | | | |
|---|---|---|---|
| 3,738,882 | 6/1973 | Basi | 156/636 |
| 3,869,324 | 3/1975 | Basi et al. | 156/636 |
| 4,448,634 | 5/1984 | Lampert | 156/636 |
| 4,732,648 | 3/1988 | Fronius et al. | 156/636 |

*Primary Examiner*—William A. Powell
*Attorney, Agent, or Firm*—Armstrong, Nikaido Marmelstein, Kubovcik & Murray

[57] ABSTRACT

The present invention polishes the surface of a substrate or epitaxial layer of $Al_xGa_{1-x}As$ wherein $0<x<1.0$ with a polishing liquid comprising an aqueous alkali hypochlorite solution or a mixture of said aqueous solution with an alkali carbonate, said liquid being regulated to a pH value ranging from 8.0 to 11.0, and further containing a powder such as $SiO_2$ or a colloidal material such as colloidal silica having a fine particle size to afford a planar mirror-surface to said surface, thereby preventing wafer cracking or pattern flowing during patterning by photomasks and improving yields.

7 Claims, 1 Drawing Sheet

METHOD FOR POLISHING ALGAAS SURFACES

BACKGROUND OF THE INVENTION

The present invention relates to an AlGaAs surface polishing method for polishing the surfaces of AlGaAs layers formed on GaAs substrates by epitaxial growth or AlGaAs substrates to afford a planar mirror-surface thereto.

In general and in most cases, the AlGaAs substrates used as high-luminance LED chips have industrially been obtained by forming AlGaAs layers on GaAs substrates by epitaxial growth, followed by the removal of the GaAs substrates of light absorptivity. In this case, since the GaAs substrates have a lattice constant of 5.6533 Å whereas, for instance, $Al_{0.7}Ga_{0.3}As$ has a lattice constant of 5.6588 Å, a number of misfit transitions occur on the surface thereof due to a difference in the lattice constants.

Some transitions are released since they give rise to cracking in the crystals in the vicinity of the interface during epitaxial growth and take on a mosaic structure; however, another transitions propagate through the epitaxial layer in the the growth direction and reach the surface thereof.

As a result, warping, which has occurred prior to the removal of the GaAs substrates due to a difference in the coefficient of thermal expansion, is eliminated from the AlGaAs substrates after the removal of the GaAs substrates. However, purterbations of the lattice planes still remain in the vicinity of the crystal surfaces, and since the rate of epitaxial growth has a distribution within the wafer plane, irregularities occur on the surface thereof. It is to be understood that in the LPE method, such irregularities are about 10 μm in magnitude.

Not until now has the polishing of AlGaAs been carried out. In order to afford mirror or planar surfaces to AlGaAs, the grown epitaxial layer of AlGaAs has merely been etched to about several μm with $Cl_2$, etc. in gas systems and with phosphates, sulfates, etc. in wet systems.

Only with etching, however, it has been difficult to produce a uniform and planar mirror-surface in the plane of a large-area wafer having thereon irregularities of as large as ten plus several μm.

For that reason, it is conceived to produce a planar mirror-surface by polishing. However, special attention should be paid to such polishing, since the surface conditions of such AlGaAs substrates are not substantially found in ordinary GaAs wafers.

The polishing liquid used for polishing serves to uniformly oxidize AlGaAs, but should not allow the oxidation reaction to proceed further after the formation of an oxide film.

Since the surfaces of the AlGaAs substrates are not always formed of the same homogeneous lattice planes due to their perturbations, irregularities may become more noticeable by reason that there is a difference in the reaction with the polishing liquid due to a difference in the crystal lattice planes.

In a case where the reaction continues to proceed to such an extent that the formed oxide film dissolves in the polishing liquid, irregularities again become more noticeable, thus making it impossible to obtain a planar mirror-surface.

An alternative polishing method widely available for Si wafers, GaAs wafers and the like makes use of several types of abrasives differing in particle sizes. However, this method is impractical for the AlGaAs substrates on the order of 200 μm, since there is a need of leaving a margin of several μm or more for the purpose of preventing the abrasives for causing damage thereto.

SUMMARY OF THE INVENTION

It is an object of the present invention to provide a method for polishing AlGaAs surfaces which can eliminate all the process imperfections caused by surface irregularities during handling of AlGaAs by providing planar mirror-surfaces to the surfaces of AlGaAs layers or AlGaAs substrate wafers formed on GaAs substrates.

According to the present invention, $Al_xGa_{1-x}As$ wherein $0<x<1.0$ is polished on the surface with a mixed liquid of an alkali hypochlorite liquid with an alkali carbonate solution, which is regulated to a pH value ranging from 8.0 to 11.0, and a powdery or colloidal material such as powdery or colloidal $SiO_2$ is added to said mixed liquid so as to better the polishing effect.

As the polishing liquid, use may be made of, e.g., 0.1 to 3% of sodium hypochlorite and 0 to 5 g/l of sodium carbonate, regulated to a pH value ranging form 8.0 to 11.0. The higher the concentration of sodium hypochlorite, the higher the polishing rate and the productivity. As that rate increases, however, difficulty is involved in the control of the amount to be polished and the surface roughness goes wrong. It is thus desired that polishing be carried out at two or more steps with different polishing liquids. For example, the two-step polishing is performed in the following manner.

(1) Primary Polishing Liquid
Sodium hypochlorite: 1 to 3%.
Sodium carbonate: 1 to 5 g/l.
pH value: 9 to 11.
(2) Secondary Polishing Liquid
Sodium hypochlorite: 0.1 to 3%.
Sodium carbonate: 0 to 2 g/l.
pH value: 8 to 10.

Further, a powdery or colloidal material such as powdery or colloidal $SiO_2$ may be added to both the primary and secondary polishing liquids, thereby achieving further improvements in flatness. The particle size and concentration are then as follows.

Particle size of powders and colloids: 0.01 to 0.1 μm.
Concentration of powders and colloids: 0.1 to 5%.

GaAs and AlAs are oxidized by the mixed liquid of the alkali hypochlorite liquid with the alkali carbonate solution according to the following reaction formulae.

$$GaAs + 4NaOCl + 4Na_2CO_3 + 4H_2O \rightarrow 4NaGa(OH)_4 + 4Na_2CO_3 + 4NaCl$$

$$AlAs + 4NaOCl + 4Na_2CO_3 + 4H_2O \rightarrow 4NaAl(OH)_4 + 4NaHCO_3 + 4NaCl$$

Both the formed $NaGa(OH)_4$ and $4NaAl(OH)_4$ are deposited to the surface of AlGaAs without dissolution, but may be removed by mechanical polishing under suitable pressure on a polishing cloth due to their limited adhesion.

The state (flatness) of the polished AlGaAs surface is improved by decreasing the concentration of the polishing liquid used at the subsequent step(s) and, at the same time, by decreasing the mesh size of the polishing cloth used at the subsequent step(s), i.e., changing the polishing cloth used at the subsequent step from the unwoven fabric type to the suede type of urethane foam. Use of the polishing liquids containing powdery or colloidal SiO$_2$ is effective for further improvements in the flatness and mirror-surface state.

DESCRIPTION OF THE PREFERRED EMBODIMENT

Example 1

This example illustrates an Al$_{0.75}$Ga$_{0.25}$As substrate polished at the two-stage primary and secondary steps.

Primary Polishing

Polishing Liquid Used

One hundred (100) g of anhydrous sodium carbonate were mixed with 20 l of a 2% aqueous solution of sodium hypocholorite, and the mixture was regulated to pH 10.5 by hydrochloric acid.

Polishing Cloth Used

An unwoven fabric type polishing cloth was used.

Polishing Method

A pressure of 100 g/cm$^2$ is applied to the Al$_{0.75}$Ga$_{0.25}$As substrate to hold the unwoven fabric type polishing cloth thereagainst. While the polishing cloth is rotated at 40 r.p.m., the polishing liquid is supplied to the surface of contact of the substrate with the polishing cloth at a rate of 600 cc/min.

Secondary Polishing

Polishing Liquid Used

An 1% aqueous solution of sodium hypochlorite was regulated to pH 10.5 with hydrochloric acid.

Polishing Compound Used

A suede type polishing cloth of urethane foam was used.

Polishing Method

A pressure of 50 g/cm$^2$ is applied to the Al$_{0.75}$Ga$_{0.25}$As substrate to hold the suede type polishing cloth thereagainst. While rotating the polishing cloth at 40 r.p.m., the polishing liquid is supplied to the surface of contact of the substrate with the polishing clothe at a rate of 600 cc/min.

Results of Polishing

Before polishing, the surface of the substrate was found to have sharp irregularities thereon and be covered with an oxide film. However, a generally planar mirror-surface was obtained after the primary polishing, but that surface was found to be partly flawed by polishing. The secondary polishing was subsequently carried out, whereby such surface flaws were removed, thus providing a satisfactory planar mirror-surface.

Comparative Example

An Al$_{0.75}$Ga$_{0.25}$As substrate was etched with a sulfuric acid base polishing liquid (H$_2$SO$_4$:H$_2$O$_2$:H$_2$O=3:1:1). It was found that the surface remained roughened, including a number of minute projections.

Example 2

Figure 1:
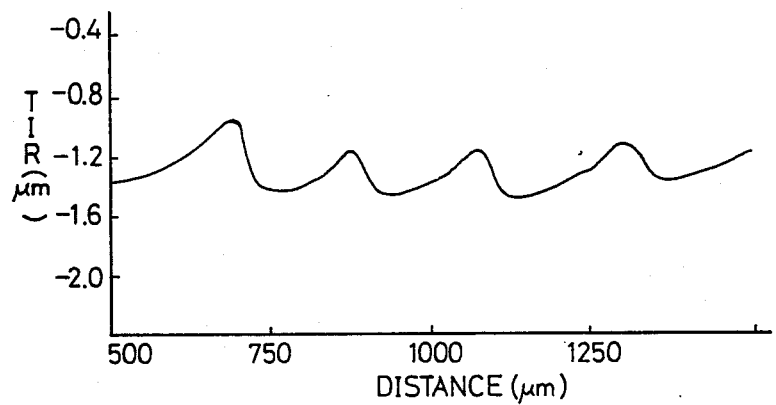
FIG. 1 is a graph illustrating the irregularities of an epitaxially grown surface with TIR as ordinate.

Referring to the surface irregularities of Al$_{0.75}$Ga$_{0.25}$As formed on the GaAs substrate by epitaxial growth, the TIR was 555 nm (28 nm calculated as a wafer of 2 inches $\phi$ in diameter) in a length range of 1000 $\mu$m, as illustrated in FIG. 1 with TIR (a difference between the maximum peak and minimum trough of irregularities) as ordinate.

Figure 2:
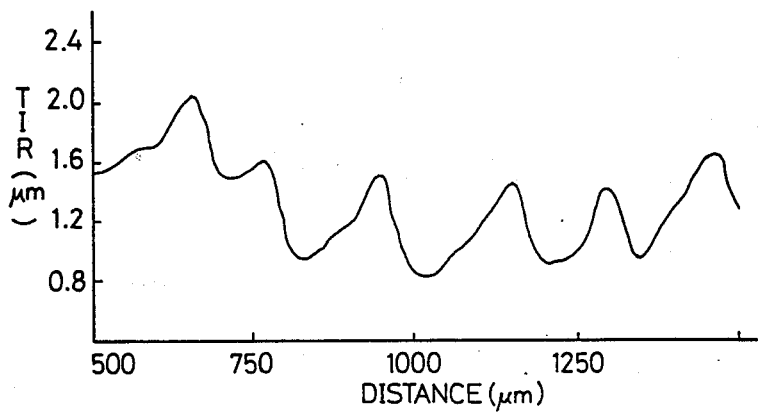
FIG. 2 is a graph illustrating the irregularities of an etched surface with TIR as ordinate.

This was etched to 10 $\mu$m at 22° C. with phosphoric acid:H$_2$O$_2$:H$_2$O=1:1:10. As a result, the TIR was found to be 1160 nm (58 $\mu$m calculated as a wafer of 2 inches $\phi$ in diameter) in a length range of 1000 $\mu$m, as illustrated in FIG. 2.

Figure 3:
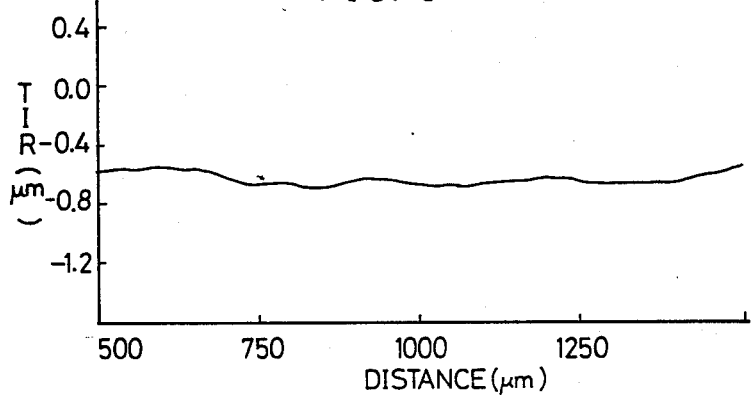
FIG. 3 is a graph illustrating the irregularities of a surface after polishing with TIR as ordinate.

Next, 20 $\mu$m-polishing was carried out under the conditions described in Example 1. Obtained as a result was a surface expressed in terms of a TIR of 180 nm (9 $\mu$m calculated as a wafer of 2 inches $\phi$ in diameter) in a length range of 1000 $\mu$m, as illustrated in FIG. 3.

Heretofore, one cause for reductions in the yield of N-clad layers has been attributed to a flow of electrode patterns effected by their large irregularities. According to the present invention, however, neither wafer cracking nor pattern flowing takes place, for instance, during patterning by photomasks, thus resulting in an increase in the yield. In addition, uniform wafer thickness assures easy handling of post-treatment steps.

What is claimed is:

1. A method for polishing AlGaAs surfaces, in which a substrate or epitaxial layer of Al$_x$Ga$_{1-x}$As wherein $0<x<1.0$ is polished on the surface with the use of a hypochlorite base polishing liquid.

2. A method for polishing AlGaAs surfaces as claimed in claim 1, wherein said polishing liquid comprises an aqueous alkali hypochlorite solution or a mixed solution of said aqueous solution with an alkali carbonate, is regulated to a pH value of 8.0 to 11.0, and is added with a powdery or colloidal material having a fine particle size, such as powdery or colloidal SiO$_2$.

3. A method for polishing AlGaAs surfaces as claimed in claim 2, wherein said powdery or colloidal material has a particle size of 0.01 to 0.1 $\mu$m.

4. A method for polishing AlGaAs surfaces as claimed in claim 2, wherein said powdery or colloidal material has a concentration of 0.1 to 5%.

5. A method for polishing AlGaAs surfaces as claimed in claim 1 or 2, which is carried out at two or more steps with varied concentrations of said polishing liquid.

6. A method for polishing AlGaAs surfaces as claimed in claim 5, wherein a primary polishing liquid comprises 1 to 3% of sodium hypochlorite and 1 to 5 g/l of sodium carbonate, and is regulated to a pH value ranging from 9 to 11.

7. A method for polishing AlGaAs surfaces as claimed in claim 5, wherein a secondary polishing liquid comprises 0.1 to 3% of sodium hypochlorite and 1 to 2 g/l of sodium carbonate, and is regulated to a pH value ranging from 8 to 10.

* * * * *